(12) United States Patent
Kimura et al.

(10) Patent No.: US 12,120,825 B2
(45) Date of Patent: Oct. 15, 2024

(54) PERIPHERY MONITORING DEVICE

(71) Applicant: FUJI CORPORATION, Chiryu (JP)

(72) Inventors: Masashi Kimura, Nishio (JP); Sota Mizuno, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 436 days.

(21) Appl. No.: 17/635,618

(22) PCT Filed: Sep. 23, 2019

(86) PCT No.: PCT/JP2019/037151
§ 371 (c)(1),
(2) Date: Feb. 15, 2022

(87) PCT Pub. No.: WO2021/059317
PCT Pub. Date: Apr. 1, 2021

(65) Prior Publication Data
US 2022/0295680 A1 Sep. 15, 2022

(51) Int. Cl.
*H05K 13/08* (2006.01)
*B25J 9/16* (2006.01)
(Continued)

(52) U.S. Cl.
CPC .......... *H05K 13/081* (2018.08); *B25J 9/1676* (2013.01); *B25J 13/08* (2013.01); *H05K 13/02* (2013.01)

(58) Field of Classification Search
CPC .. H05K 13/0888; H05K 13/081; H05K 13/02; B25J 9/1676; B25J 13/08
See application file for complete search history.

(56) References Cited

U.S. PATENT DOCUMENTS 11,703,569 B2 * 7/2023 Hall ................ G01S 17/42
356/5.03
11,796,648 B2 * 10/2023 Hall ................ G01S 17/42
(Continued)

FOREIGN PATENT DOCUMENTS

JP 1-222889 A 9/1989
JP 2015-170284 A 9/2015
(Continued)

OTHER PUBLICATIONS

International Search Report mailed on Nov. 12, 2019 in PCT/JP2019/037151 filed on Sep. 23, 2019 (2 pages).

*Primary Examiner* — Jaime Figueroa
*Assistant Examiner* — Zachary Joseph Wallace
(74) *Attorney, Agent, or Firm* — Oblon, McClelland, Maier & Neustadt, L.L.P.

(57) ABSTRACT

A periphery monitoring device includes monitoring areas in at least three directions of moving body. Safety laser scanners are mounted to the moving body for each of the monitoring areas in the directions. A monitoring area in at least one direction is a three-dimensional monitoring area, and a monitoring area in the other direction is a horizontal monitoring area to be monitored in two dimensions in a horizontal direction. The safety laser scanner configured to monitor the three-dimensional monitoring area is mounted to an upper portion of the moving body, and the three-dimensional monitoring area forms an inclined plane-like monitoring area. A safety laser scanner configured to monitor the horizontal monitoring area is mounted to the lower portion of the moving body, and the horizontal monitoring area forms a horizontal plane-like monitoring area from the lower portion of the moving body.

6 Claims, 5 Drawing Sheets

(51) Int. Cl.
    *B25J 13/08*         (2006.01)
    *H05K 13/02*      (2006.01)

(56) References Cited

U.S. PATENT DOCUMENTS

| | | | | |
|---|---|---|---|---|
| 2012/0123563 | A1* | 5/2012 | Drinkard | H04N 7/181 |
| | | | | 700/13 |
| 2017/0191822 | A1* | 7/2017 | Becker | G06T 7/33 |
| 2018/0111269 | A1 | 4/2018 | Yamamoto | |
| 2019/0101623 | A1* | 4/2019 | Galera | G01S 17/88 |
| 2020/0371237 | A1* | 11/2020 | Schindler | G01S 7/4802 |
| 2022/0187428 | A1* | 6/2022 | Liaqat | G01S 17/87 |
| 2022/0291685 | A1* | 9/2022 | Inacio De Matos | |
| | | | | G05D 1/0238 |

FOREIGN PATENT DOCUMENTS

| | | |
|---|---|---|
| JP | 2017-122634 A | 7/2017 |
| JP | 2018-32279 A | 3/2018 |
| WO | WO 2019/087392 A1 | 5/2019 |
| WO | WO 2021/053832 A1 | 3/2021 |

* cited by examiner

PERIPHERY MONITORING DEVICE

TECHNICAL FIELD

The present specification relates to a technology regarding a periphery monitoring device for monitoring at least three directions of a moving body.

BACKGROUND ART

In recent years, for example, in a component mounting line, as described in Patent Literature 1 (International Publication No. WO2019/087392), a feeder automatic exchange robot has been movably provided in a moving lane provided along an array of multiple component mounters constituting a component mounting line, the feeder automatic exchange robot has been moved to a front side of a component mounter for which an automatic exchange request was generated, so that the feeder is automatically exchanged with respect to a feeder setting base of the component mounter.

Generally, when any error generates in any of the component mounters to stop the production of the component mounter during the operation of the component mounting line, an operator performs an operation such as inspection or adjustment of the component mounter to resume the production of the component mounter. In this case, in order to secure the safety of the operator with respect to the feeder automatic exchange robot, in the component mounting line of Patent Literature 1, three peripheral directions of a lower portion of the feeder automatic exchange robot are monitored by two safety laser scanners mounted to corner portions on both sides of the lower portion of the front side (operator side) of the feeder automatic exchange robot, so that when the operator inadvertently intrudes the monitoring area, the safety laser scanner detects the intrusion to cause the operation of the feeder automatic exchange robot to be stopped in an emergency manner.

PATENT LITERATURE

Patent Literature 1: International Publication No. WO2019/087392

BRIEF SUMMARY

Technical Problem

A monitoring area monitored by a safety laser scanner provided in a corner portion of a lower portion of a front surface of a feeder automatic exchange robot is a horizontal plane-like monitoring area which is two-dimensionally monitored in a horizontal direction along a floor surface. In this configuration, it is impossible to detect a flying object flying toward the feeder automatic exchange robot above the monitoring area, or it is impossible to detect a rod-shaped object even if a tip of the rod-shaped object or the like held by an operator or the like approaches the feeder automatic exchange robot above the monitoring area. Therefore, it is impossible to ensure security against the flying object, the rod-shaped object, or the like intruding above the monitoring area.

In addition, the conventional monitoring area is set so as to detect the foot of the operator, if the foot of the operator is outside the monitoring area, it is impossible to perform the detection even if the fingertip of the operator extends toward the feeder automatic exchange robot above the monitoring area. Therefore, in order to ensure security, it is necessary to set a large monitoring area in consideration of a range in which the fingertip of the operator extends. Generally, the larger the monitoring area, the greater the frequency at which the operator inadvertently intrudes and is detected in the monitoring area is, thereby increasing the frequency at which the operation of the feeder automatic exchange robot is stopped in an emergency manner, and reducing the productivity. In addition, the larger the monitoring area, the narrower a work area in which the operator can safely operate, so that the efficiency is also reduced.

Solution to Problem

In order to solve the above-mentioned problems, there is provided a periphery monitoring device in which monitoring areas are set in at least three directions of a moving body, wherein a safety laser scanner is mounted to the moving body for each of the monitoring areas in the directions, a monitoring area in at least one direction is a three-dimensional monitoring area to be monitored in three dimensions, and a monitoring area in the other direction is a horizontal monitoring area to be monitored in two dimensions in a horizontal direction, a safety laser scanner configured to monitor the three-dimensional monitoring area is mounted to an upper portion of the moving body, the three-dimensional monitoring area forming an inclined plane-like monitoring area in which an interval from the moving body gradually increases from the upper portion to a lower portion of the moving body, and a safety laser scanner configured to monitor the horizontal monitoring area is mounted to the lower portion of the moving body, the horizontal monitoring area forming a horizontal plane-like monitoring area from the lower portion of the moving body.

In this configuration, since the monitoring area in at least one direction is the three-dimensional monitoring area that is three-dimensionally monitored from the upper portion obliquely downward the moving body, it is possible to detect a flying object, a rod-shaped object, or the like intruding toward the moving body in the three-dimensional monitoring area, so that it is possible to ensure security against the flying object, the rod-shaped object, or the like. In addition, in the three-dimensional monitoring area, since the detection can be made as long as the fingertip of the operator approaches the moving body side, it is not necessary to set the horizontal distance of the three-dimensional monitoring area to be large in consideration of the range in which the fingertip of the operator extends. Therefore, it is possible to make the horizontal distance of the three-dimensional monitoring area be shorter than the horizontal distance of the conventional monitoring area. Therefore, it is possible to reduce the frequency at which the operator inadvertently intrudes the three-dimensional monitoring area and is detected compared to the conventional art, and also to secure productivity. In addition, it is possible to reduce the area where the work area in which the operator can safely work is narrowed by the three-dimensional monitoring area as compared with the conventional art, so that the efficiency can be secured.

Whether the monitoring area in each direction around the moving body is to be the three-dimensional monitoring area or the horizontal monitoring area may be determined, for example, in consideration of the type of the moving body, a positional relationship between a traveling path of the moving body and the work area, the movement direction of the moving body, and the like.

DESCRIPTION OF EMBODIMENTS

Hereinafter, an embodiment in which the present disclosure is applied to feeder automatic exchange robot 26 of component mounter 10 will be described.

A configuration of component mounting line 10 will be described based on FIGS. 1 and 2. Component mounting line 10 is configured by arranging multiple component mounters 12 in a row along a conveyance direction (X-direction) of circuit board 11, and a solder printer (not illustrated) for printing solder on circuit board 11, feeder storage device 19 for storing cassette-type feeders 14, and the like are installed on a board loading side of component mounting line 10.

Figure 1:
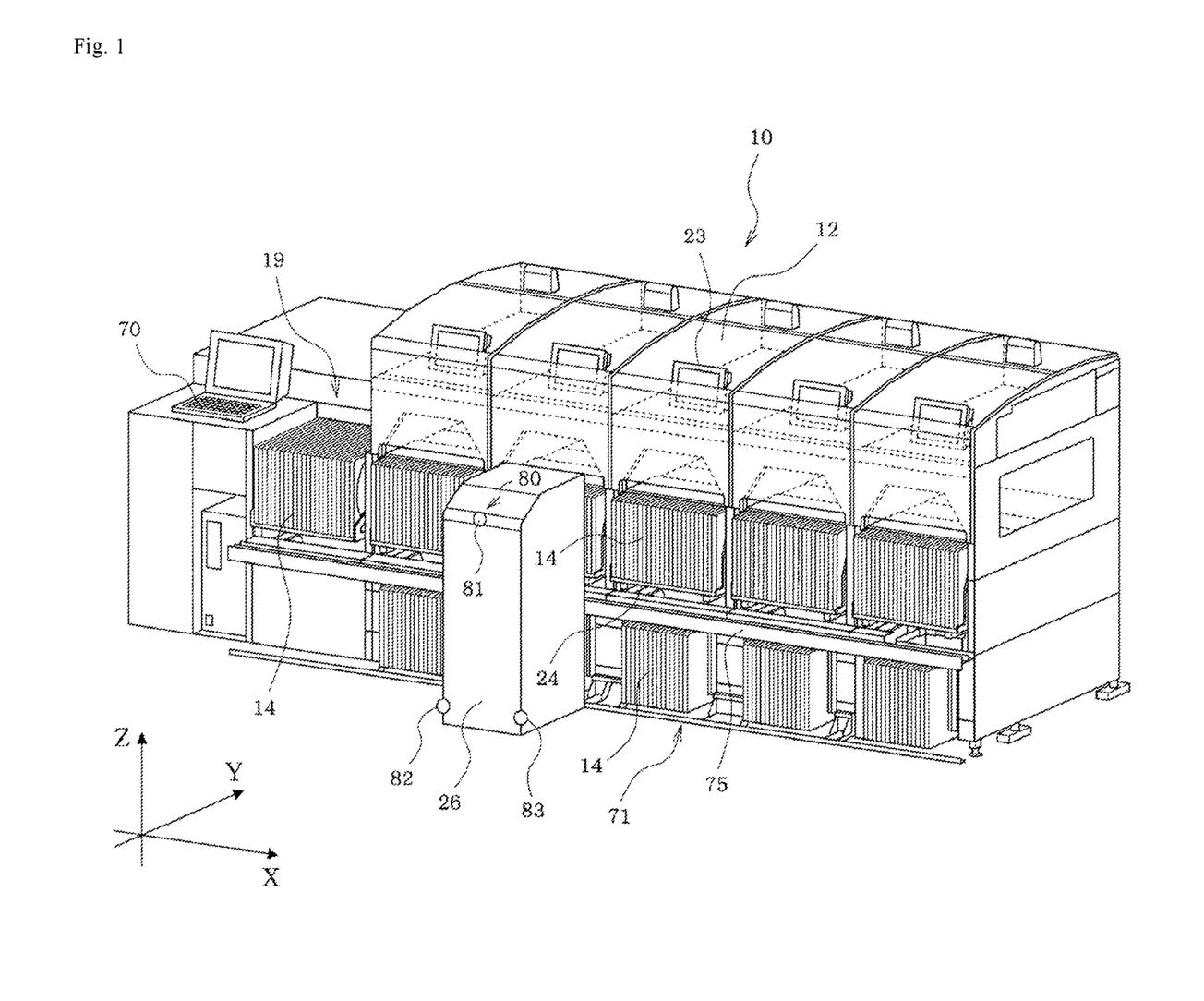
FIG. 1 is a perspective view illustrating an entire configuration of a component mounting line in an embodiment.
Figure 2:
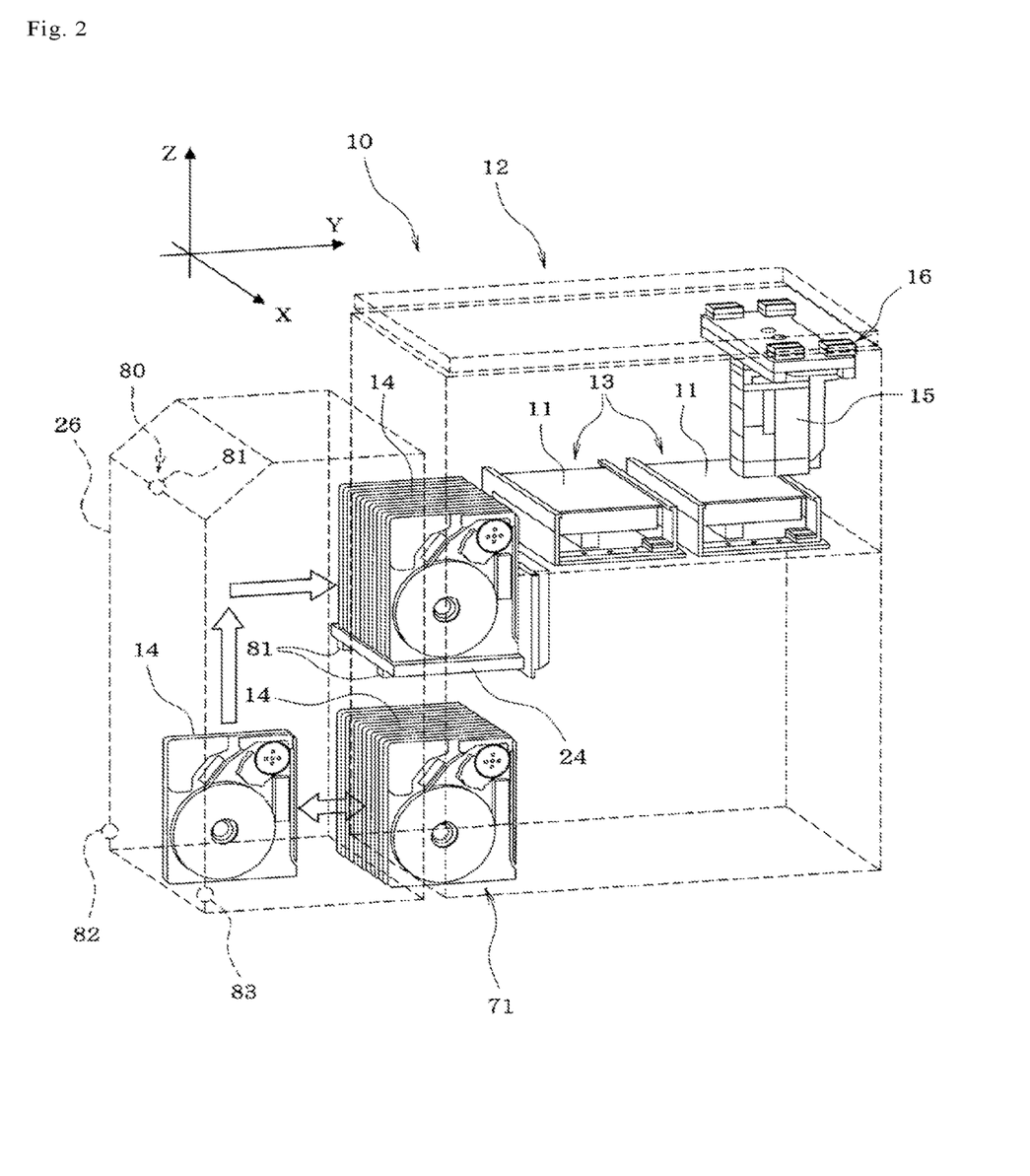
FIG. 2 is a perspective view schematically illustrating configurations of a feeder automatic exchange robot and a component mounter.

As illustrated in FIG. 2, each component mounter 12 is provided with two conveyors 13 for conveying circuit board 11, feeder setting base 24 (see FIG. 1) for exchangeably setting multiple cassette-type feeders 14, mounting head 15 for holding a suction nozzle (not illustrated) for picking up a component supplied from cassette-type feeder 14 set on feeder setting base 24 and mounting the same on circuit board 11, head moving device 16 for moving mounting head 15 in XY-directions (left-right and front-rear directions), component imaging camera 17 (see FIG. 5) for imaging the component picked up by the suction nozzle from below, and the like. Mark imaging camera 18 (see FIG. 5) for imaging a reference mark (not illustrated) of circuit board 11 is attached to head moving device 16 so as to move integrally with mounting head 15 in XY-directions.

Figure 5:
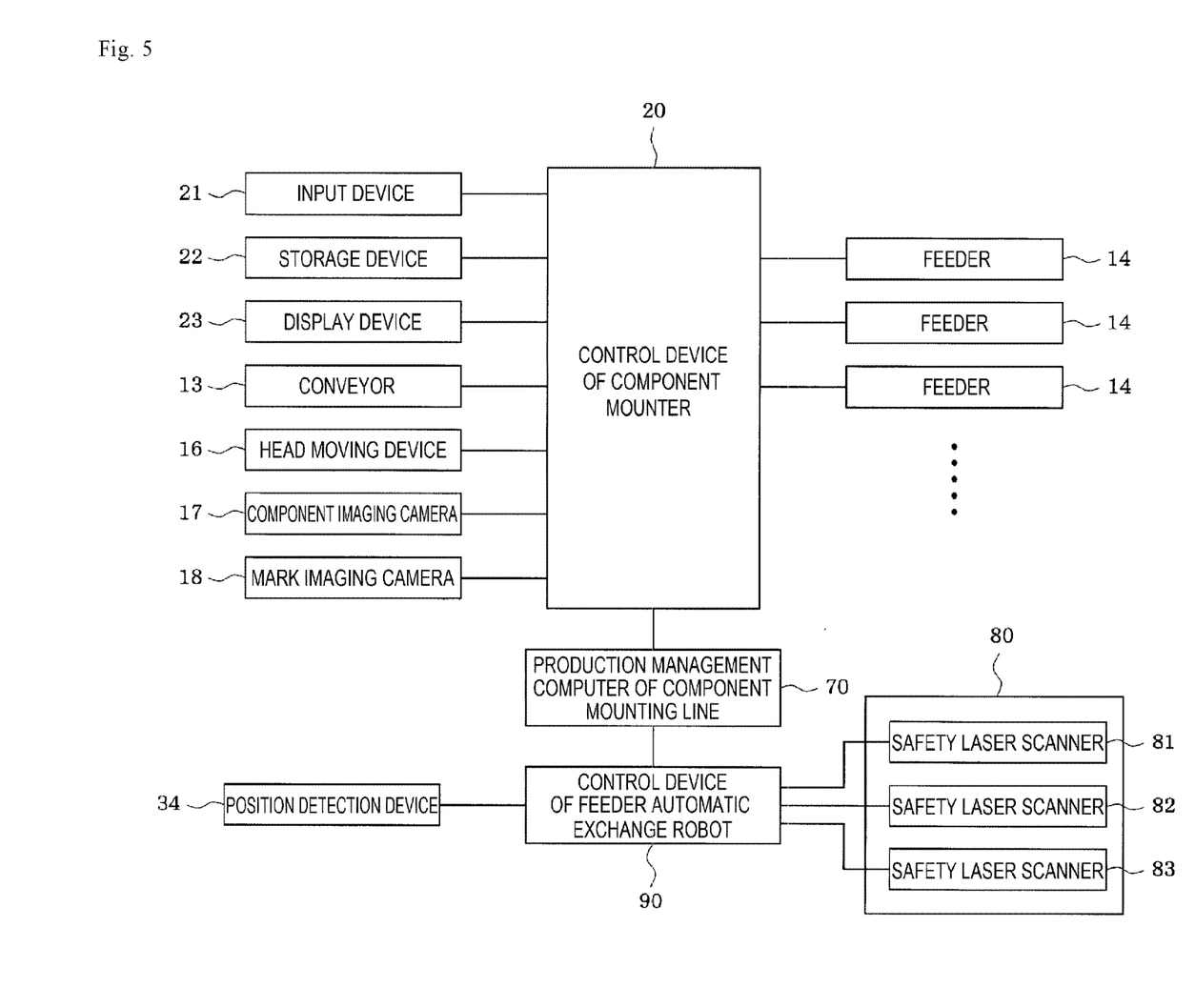
FIG. 5 is a block diagram schematically illustrating a configuration of a control system of a component mounting line with a feeder automatic exchange robot.

In addition, as illustrated in FIG. 5, input device 21 such as a keyboard, a mouse, and a touch panel, storage device 22 such as an HDD, an SSD, a ROM, or a RAM, for storing various programs for control and various data, display device 23 such as a liquid crystal display or a CRT are connected to control device 20 of component mounter 12. Control device 20 of each component mounter 12 is connected, via a network, to production management computer 70 that manages production of entire component mounting line 10, such that the production of entire component mounting line 10 is managed by production management computer 70.

Each component mounter 12 of component mounting line 10 conveys circuit board 11 conveyed from upstream component mounter 12 to a predetermined position with conveyor 13, clamps and positions circuit board 11 with a clamping mechanism (not illustrated), images a reference mark of circuit board 11 with mark imaging camera 18, recognizes a position (reference position of circuit board 11) of the reference mark, picks up the component supplied from feeder 14 with the suction nozzle of mounting head 15, moves the component from a suction position to an imaging position, images the component from below with component imaging camera 17, determines a suction positional deviation amount of the component, or the like, and then moves mounting head 15 to correct the suction positional deviation amount, and mounts the component on circuit board 11 on conveyor 13 to produce the component mounting board.

As illustrated in FIG. 1, feeder automatic exchange robot 26 (autonomous running robot) for setting and/or detaching (hereinafter, referred to as "automatic exchange") feeder 14 to and from feeder setting base 24 of each component mounter 12 is installed on the front side of component mounting line 10. Below feeder setting base 24 of each component mounter 12, stock section 71 for accommodating multiple feeders 14 to be set in feeder setting base 24 is provided. Feeder automatic exchange robot 26 moves to the front side of component mounter 12 for which an automatic exchange request has generated when the automatic exchange request for feeder 14 generates in any of multiple component mounters 12 constituting component mounting line 10, takes out feeder 14 of an exchange target from feeder setting base 24 of component mounter 12, collects feeder 14 in stock section 71, and takes out necessary feeder 14 from stock section 71 to set feeder 14 in feeder setting base 24. Feeder automatic exchange robot 26 may perform only an operation of collecting feeder 14 taken out from feeder setting base 24 into stock section 71 in response to the automatic exchange request, or conversely, may perform only an operation of setting feeder 14 taken out from stock section 71 in an empty slot of feeder setting base 24.

On the front side of component mounting line 10, guide rail 75 for moving feeder automatic exchange robot 26 (moving body) in X-direction (right-left direction) along the array of component mounters 12 is provided so as to extend in X-direction over entire component mounting line 10. A board loading side of guide rail 75 extends to feeder storage device 19, so that feeder automatic exchange robot 26 moves to the front side of feeder storage device 19 so that feeder automatic exchange robot 26 takes out feeder 14 necessary for the automatic exchange from feeder storage device 19 or returns used feeder 14 into feeder storage device 19.

Feeder automatic exchange robot 26 is provided with position detection device 34 (see FIG. 5) for detecting the position of feeder automatic exchange robot 26 with respect to component mounting line 10. When the automatic exchange request is generated in any of component mounters 12, control device 90 of feeder automatic exchange robot 26 controls an operation of moving to component mounter 12 where the automatic exchange request is generated to perform the automatic exchange of feeder 14 while detecting the position of feeder automatic exchange robot 26 by a detected signal of position detection device 34.

In addition to the automatic exchange of feeder 14, although not illustrated, feeder automatic exchange robot 26 is configured to be capable of automatically exchanging a cassette-type nozzle exchange unit accommodating a suction nozzle for exchange, a cassette-type calibration component supply unit supplying a calibration component, and the like with respect to feeder setting base 24.

Production management computer 70 also serves as a control device for controlling the movement of feeder automatic exchange robot 26 in cooperation with control device 90 of feeder automatic exchange robot 26, monitors whether the automatic exchange request has generated in any of multiple component mounters 12 constituting component mounting line 10 during production, and transmits the information to control device 90 of feeder automatic exchange robot 26 when an automatic exchange request has generated in any of component mounters 12, thereby moving feeder automatic exchange robot 26 to the front side of component mounter 12 for which the automatic exchange request has generated. Alternatively, control device 90 of feeder automatic exchange robot 26 may directly acquire the information of component mounter 12 for which the automatic exchange request has been generated from component mounter 12 via a network, so that feeder automatic exchange robot 26 moves to the front side of component mounter 12.

In addition, feeder automatic exchange robot 26 is provided with periphery monitoring device 80 that monitors three directions around feeder automatic exchange robot 26. In periphery monitoring device 80, monitoring areas A, B, and C (refer to FIGS. 3 and 4) are set in three directions around feeder automatic exchange robot 26, and safety laser scanners 81, 82, and 83 are mounted for monitoring areas A, B, and C, respectively. Each of safety laser scanners 81, 82, and 83 is a safety sensor that changes an irradiating angle of the laser light with which monitoring areas A, B, and C are irradiated, scans an inside of each of monitoring areas A, B, and C with the laser light, and receives the laser light reflected upon hitting the detection target to detect a detection target that has intruded into each of monitoring areas A, B, and C. A width and a shape of each of monitoring areas A, B, and C, which is a detection area of each of safety laser scanners 81, 82, and 83, can be arbitrarily changed by a user.

Figure 3:
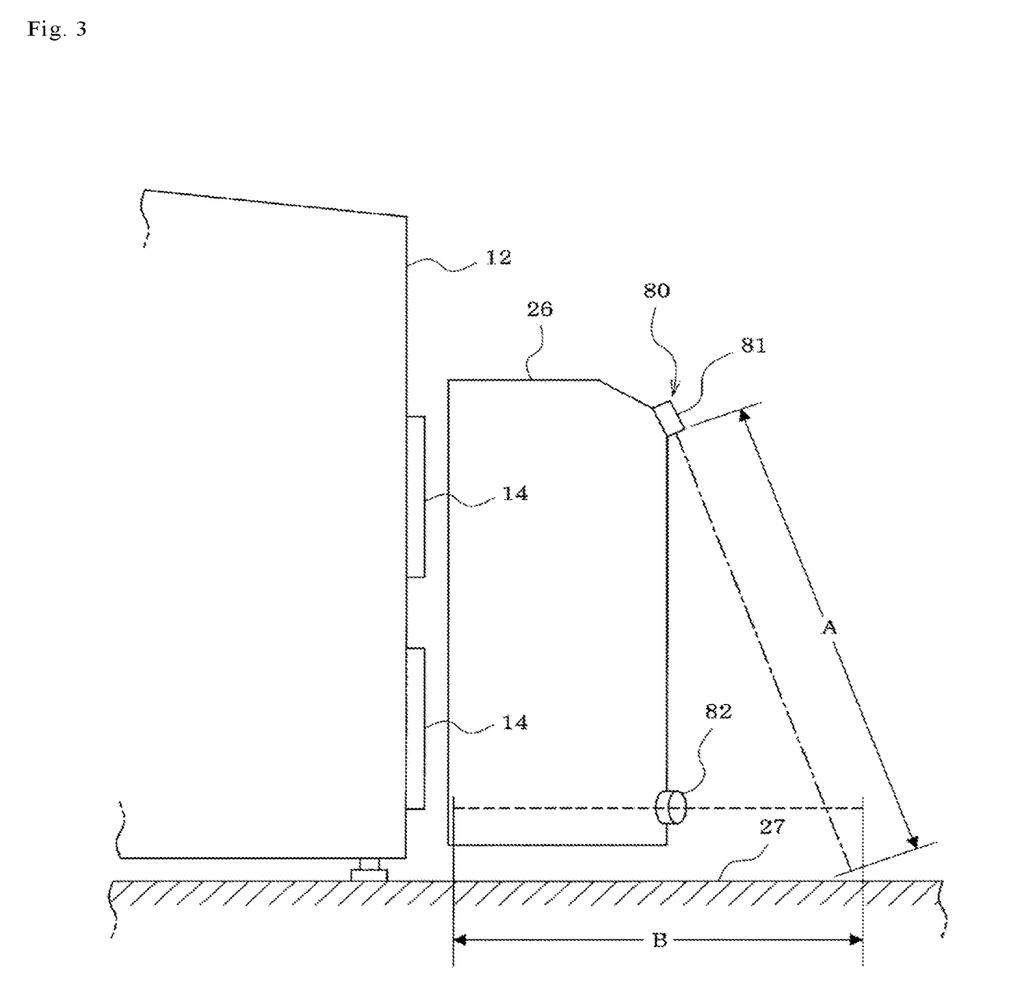
FIG. 3 is a side view for explaining a monitoring area around the feeder automatic exchange robot.

Monitoring area A (region indicated by dots in FIG. 4) for monitoring front of feeder automatic exchange robot 26, which is a direction different from the movement direction (X-direction and the opposite direction thereto) of feeder automatic exchange robot 26, is three-dimensional monitoring area A for three-dimensionally monitoring. Safety laser scanner 81 for monitoring three-dimensional monitoring area A is configured to be mounted to a center portion of an upper front end of feeder automatic exchange robot 26 so that three-dimensional monitoring area A forms an inclined plane-like monitoring area in which an interval from a front surface of feeder automatic exchange robot 26 is gradually increased from an upper portion to a lower portion of feeder automatic exchange robot 26, as illustrated in FIG. 3.

When determining an inclination angle of three-dimensional monitoring area A, a safety distance, which is a horizontal distance from a danger source (portion where feeder 14 is inserted and removed) on the front surface of component mounter 12, may be calculated by the following equation, and the inclination angle of three-dimensional monitoring area A may be determined such that the horizontal distance from the danger source to three-dimensional monitoring area A is equal to the safety distance.

$$\text{Safety distance} = (V_{max} \times T1) + S1 + \Delta S + (V_{man} \times T2) + S2$$

Here, Vmax is a maximum speed of feeder automatic exchange robot 26, T1 is a time from the time when an object enters the danger area to the time when feeder automatic exchange robot 26 starts to apply the brake, S1 is a braking distance of feeder automatic exchange robot 26, ΔS is a measurement error of safety laser scanner 81, Vman is an intrusion speed of a person, T2 is a time from the time when the object enters the danger area to the time when feeder automatic exchange robot 26 stops, and S2 is a distance when a part of the body approaches the danger area before the person intrudes the danger area.

Figure 4:
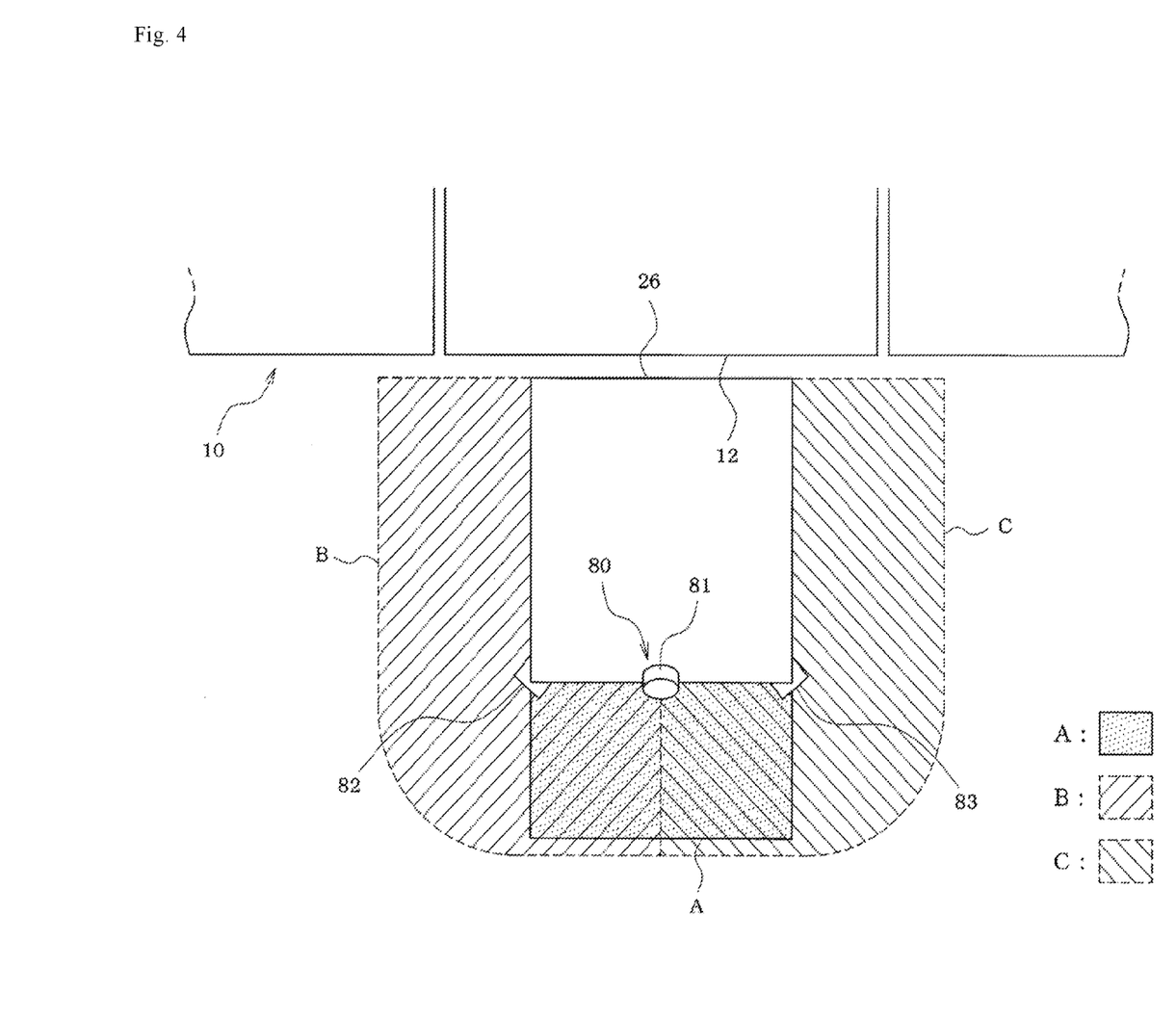
FIG. 4 is a plan view for explaining the monitoring area around the feeder automatic exchange robot.

On the other hand, monitoring areas B and C (regions indicated by left hatched lines and right hatched lines in FIG. 4) for monitoring the right-left direction, which is the movement direction (X-direction and the opposite direction thereto) of feeder automatic exchange robot 26, are horizontal monitoring areas B and C for two-dimensionally monitoring in the horizontal direction. Safety laser scanners 82 and 83 for monitoring horizontal monitoring areas B and C in the right-left direction are mounted to the lower portion of feeder automatic exchange robot 26, so that horizontal monitoring areas B and C in the right-left direction are configured to form a horizontal plane-like monitoring area along floor surface 27 from the lower portion of feeder automatic exchange robot 26.

Further, in the present embodiment, safety laser scanners 82 and 83 for respectively monitoring horizontal monitoring areas B and C in the right-left direction are mounted to corner portions on the side of three-dimensional monitoring area A of the lower portion of feeder automatic exchange robot 26, and a portion of horizontal monitoring areas B and C disposed on left and right both sides of three-dimensional monitoring area A protrudes so as to cover an entire gap between the lower portion of three-dimensional monitoring area A and the lower portion of the front surface of feeder automatic exchange robot 26.

Monitoring areas A, B, and C in individual directions are areas for cutting off a power source that is a power source of a driving system of feeder automatic exchange robot 26 in order to avoid collision between a person or an object intruding the area and feeder automatic exchange robot 26, thereby stopping feeder automatic exchange robot 26 in an emergency manner. When any of safety laser scanners 81, 82, and 83 detects the intrusion of the person or the object into monitoring areas A, B, and C, the power source of feeder automatic exchange robot 26 is cut off. However, even during the cutoff of the power source, a control power source that is a power source of the control system of periphery monitoring device 80 and feeder automatic exchange robot 26 is maintained, so that periphery monitoring device 80 monitors the presence or absence of the intrusion of the person or the object into monitoring areas A, B, and C in individual directions, and when the person or the object that has intruded into monitoring areas A, B, and C comes out of monitoring areas A, B, and C, the power source of feeder automatic exchange robot 26 is immediately restored to restart the movement control of feeder automatic exchange robot 26.

According to the present embodiment described above, monitoring areas A, B, and C are set in three directions around feeder automatic exchange robot 26. Monitoring area A for monitoring the front of feeder automatic exchange robot 26 in a direction different from the movement direction (X-direction and the opposite direction thereto) of feeder automatic exchange robot 26 is three-dimensional monitoring area A for three-dimensionally monitoring. Three-dimensional monitoring area A is configured to form the inclined plane-like monitoring area in which the interval from the front surface of feeder automatic exchange robot 26 gradually increases from the upper portion to the lower portion of feeder automatic exchange robot 26. Therefore, it is possible to detect a flying object, a rod-shaped object, or the like intruding the front surface of feeder automatic exchange robot 26, so that safety can be secured against the flying object, the rod-shaped object, or the like. In addition, in three-dimensional monitoring area A, since the detection can be performed as long as the fingertip of the operator approaches the front side of feeder automatic exchange robot 26, it is not necessary to set the horizontal distance of three-dimensional monitoring area A to be large in consideration of the range in which the fingertip of the operator extends. Therefore, it is possible to make the horizontal distance of three-dimensional monitoring area A be shorter than the horizontal distance of the conventional monitoring area. Therefore, it is possible to reduce the frequency at which the operator inadvertently intrudes three-dimensional monitoring area A and is detected compared to the conventional art, to reduce the frequency at which the operation of feeder automatic exchange robot 26 is stopped in an emergency manner, and also to secure productivity. In addition, it is possible to reduce the area where the work area in which the operator can safely work is narrowed by three-dimensional monitoring area A as compared with the conventional art, so that the efficiency can be secured.

Even if the operator or the like intrudes the gap between the lower portion of three-dimensional monitoring area A and the lower portion of the front surface of feeder automatic exchange robot 26 from the side (X-direction or the opposite direction thereto), during stoppage of feeder automatic exchange robot 26 or the like, the operator or the like cannot be detected by safety laser scanner 81 in three-dimensional monitoring area A unless the operator or the like enters three-dimensional monitoring area A.

As a countermeasure, in the present embodiment, monitoring areas B and C for monitoring the movement direction (X-direction and the opposite direction thereto) of feeder automatic exchange robot 26 are horizontal monitoring areas B and C for two-dimensionally monitoring the horizontal direction from the lower portion of feeder automatic exchange robot 26. Since a part of horizontal monitoring areas B and C in individual directions protrudes so as to cover the entire gap between the lower portion of three-dimensional monitoring area A and the lower portion of the front surface of feeder automatic exchange robot 26, in a case where the operator or the like intrudes the gap between the lower portion of three-dimensional monitoring area A and the lower portion of the front surface of feeder automatic exchange robot 26 from the side thereof, during the stoppage of feeder automatic exchange robot 26 or the like, it is possible to detect the operator or the like in horizontal monitoring areas B and C in the right-left direction, and to ensure security.

In the present embodiment, although a part of horizontal monitoring areas B and C in the right-left direction is configured to cover the entire gap between the lower portion of three-dimensional monitoring area A and the lower portion of the front surface of feeder automatic exchange robot 26, it is sufficient if a part of horizontal monitoring areas B and C in the right-left direction protrudes to a position overlapping the lower portion of three-dimensional monitoring area A, and there may be some gap between horizontal monitoring areas B and C in the right-left direction inside three-dimensional monitoring area A. Even with this configuration, it is possible to obtain substantially the same advantages as those in the present embodiment.

Although the present embodiment is an embodiment in which the present disclosure is applied to feeder automatic exchange robot 26, it may be applied to various types of moving bodies such as an autonomous running robot or an unmanned conveyance vehicle other than feeder automatic exchange robot 26. In this case, the monitoring area may be set in four directions of the moving body, or the monitoring area in two directions in the movement direction of the moving body or the orthogonal direction may be set as the three-dimensional monitoring area, and the monitoring area in the other two directions may be set as the horizontal monitoring area. Generally, whether the monitoring area in each direction around the moving body is to be the three-dimensional monitoring area or the horizontal monitoring area may be determined, for example, in consideration of the type of the moving body, a positional relationship between a traveling path of the moving body and the work area, the movement direction of the moving body, and the like.

It is needless to say that the present disclosure is not limited to the configuration of the above embodiment and the present disclosure can be variously changed without departing from the gist, for example, the shape of the three-dimensional monitoring area or the shape of the horizontal monitoring area may be appropriately changed.

REFERENCE SIGNS LIST

10: component mounting line, 11: circuit board, 12: component mounter, 14: cassette-type feeder, 15: mounting head, 20: control device of component mounter, 24: feeder setting base, 26: feeder automatic exchange robot (moving body, autonomous running robot), 70: production management computer, 80: periphery monitoring device, 81, 82, 83: safety laser scanner, 90: control device of feeder automatic exchange robot, A: three-dimensional monitoring area, B, C: horizontal monitoring area

The invention claimed is:

1. A periphery monitoring device in which monitoring areas are set in at least three directions of a moving body, wherein
    a safety laser scanner is mounted to the moving body for each of the monitoring areas in the directions,
    a monitoring area in at least one direction is a three-dimensional monitoring area to be monitored in three dimensions, and a monitoring area in the other direction is a horizontal monitoring area to be monitored in two dimensions in a horizontal direction,
    a safety laser scanner configured to monitor the three-dimensional monitoring area is mounted to an upper portion of the moving body, the three-dimensional monitoring area forming an inclined plane-like monitoring area in which an interval from the moving body gradually increases from the upper portion to a lower portion of the moving body, and
    a safety laser scanner configured to monitor the horizontal monitoring area is mounted to the lower portion of the moving body, the horizontal monitoring area forming a horizontal plane-like monitoring area from the lower portion of the moving body.

2. The periphery monitoring device according to claim 1, wherein the three-dimensional monitoring area is set to three-dimensionally monitor a direction different from a movement direction of the moving body.

3. The periphery monitoring device according to claim 1, wherein
    horizontal monitoring areas are disposed on both sides of the three-dimensional monitoring area, and
    a part of the horizontal monitoring areas protrudes to a position overlapping a lower portion of the three-dimensional monitoring area.

4. The periphery monitoring device according to claim 3, wherein
    the safety laser scanner configured to monitor the horizontal monitoring area is mounted to a corner portion of the lower portion of the moving body on a three-dimensional monitoring area side, and
    a part of the horizontal monitoring areas disposed on both sides of the three-dimensional monitoring areas protrudes to cover an entire gap between the lower portion of the three-dimensional monitoring area and the lower portion of the moving body.

5. The periphery monitoring device according to claim 1, wherein the moving body is an autonomous running robot.

6. The periphery monitoring device according to claim 5, wherein the autonomous running robot is a feeder automatic exchange robot that moves along an array of multiple component mounters constituting a component mounting line to automatically exchange a feeder between the feeder automatic exchange robot and each component mounter.

* * * * *